US008587558B2

(12) United States Patent
Yin et al.

(10) Patent No.: US 8,587,558 B2
(45) Date of Patent: *Nov. 19, 2013

(54) CAPACITIVE TOUCH SENSOR AND FABRICATION METHOD THEREOF AND CAPACITIVE TOUCH PANEL

(71) Applicants: Wintek (China) Technology Ltd., Guangdong Province (CN); Wintek Corporation, Taichung (TW)

(72) Inventors: Hsiang-Wei Yin, Taichung (TW); Ming-Kung Wu, Taichung (TW); Kuo-Chang Su, Tainan County (TW); Ping-Wen Huang, Taichung (TW)

(73) Assignees: Wintek Technology(H.K) Ltd., Sci & Tech Industry Park (CN); Wintek Corporation, Taichung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/767,343

(22) Filed: Feb. 14, 2013

(65) Prior Publication Data
US 2013/0155021 A1  Jun. 20, 2013

Related U.S. Application Data

(63) Continuation of application No. 13/015,262, filed on Jan. 27, 2011, now Pat. No. 8,411,067.

(30) Foreign Application Priority Data

Feb. 3, 2010   (TW) ................................ 99103209 A
Nov. 19, 2010  (TW) ................................ 99139942 A

(51) Int. Cl.
*G06F 3/045* (2006.01)

(52) U.S. Cl.
USPC ........................................... 345/174; 345/173

(58) Field of Classification Search
USPC ..................... 345/173, 174; 29/622, 829, 846
See application file for complete search history.

(56) References Cited

U.S. PATENT DOCUMENTS

| 8,209,861 | B2 | 7/2012 | Long et al. |
| 8,274,486 | B2 | 9/2012 | Barbier et al. |
| 2007/0296712 | A1 | 12/2007 | Li |
| 2008/0001925 | A1 | 1/2008 | Xiao Ping |
| 2008/0007534 | A1* | 1/2008 | Peng et al. ............... 345/173 |
| 2010/0238133 | A1 | 9/2010 | Wu et al. |
| 2010/0245285 | A1 | 9/2010 | Wang et al. |
| 2010/0265187 | A1 | 10/2010 | Chang et al. |
| 2010/0265188 | A1 | 10/2010 | Chang et al. |
| 2010/0321305 | A1 | 12/2010 | Chang et al. |

(Continued)

FOREIGN PATENT DOCUMENTS

| EP | 1 986 084 A1 | 10/2008 |
| TW | 200522148 A | 7/2005 |
| TW | M355426 U1 | 4/2009 |
| TW | M364912 U1 | 9/2009 |

*Primary Examiner* — Joe H Cheng
(74) *Attorney, Agent, or Firm* — Muncy, Geissler, Olds & Lowe, PLLC

(57) ABSTRACT

A capacitive touch sensor includes multiple first-axis traces, multiple second-axis traces, an insulation layer and multiple metal traces. Each first-axis trace includes multiple first touch-sensing pads and first connecting lines connected therebetween. Each second-axis trace includes multiple second touch-sensing pads and second connecting lines connected therebetween. At least one of the first connecting line and the second connecting line is a metal printing line.

20 Claims, 7 Drawing Sheets interval S:10-200 um
length L:10-200 um
width W:1-10 um
thickness d: 0.1-10 um

(56) References Cited

U.S. PATENT DOCUMENTS

| | | |
|---|---|---|
| 2011/0018826 A1* | 1/2011 | Shoji .............................. 345/173 |
| 2011/0063240 A1* | 3/2011 | Tanabe ........................... 345/173 |
| 2011/0090154 A1* | 4/2011 | Kuo ................................ 345/173 |
| 2011/0260741 A1 | 10/2011 | Weaver et al. |
| 2011/0279403 A1 | 11/2011 | Lee et al. |
| 2011/0310037 A1 | 12/2011 | Moran et al. |
| 2012/0044095 A1* | 2/2012 | Makovetskyy ................. 341/33 |
| 2012/0046887 A1 | 2/2012 | Xiao Ping |
| 2012/0086659 A1* | 4/2012 | Perlin et al. .................... 345/173 |
| 2012/0140392 A1 | 6/2012 | Lee et al. |
| 2012/0154312 A1 | 6/2012 | Huang et al. |
| 2012/0255167 A1 | 10/2012 | Badaye et al. |

* cited by examiner

24

R

CAPACITIVE TOUCH SENSOR AND FABRICATION METHOD THEREOF AND CAPACITIVE TOUCH PANEL

CROSS-REFERENCE TO RELATED APPLICATIONS

This application is a continuation of application Ser. No. 13/015,262, filed on Jan. 27, 2011, now U.S. Pat. No. 8,411,067 B2.

BACKGROUND OF THE INVENTION a. Field of the Invention

The invention relates to a capacitive touch sensor, a method for fabricating a capacitive touch sensor, and a capacitive touch panel.

b. Description of the Related Art

In a conventional touch panel fabrication process, a metal line fabricated by a screen printing process or a photolithography process is highly visible for a user to influence visual effect. Though such disadvantage may be overcome by narrowing the line width, the line width cannot be narrowed to a great extent due to the limit on the fabrication process. Besides, a metallic bridge structure fabricated by a general photolithography process often has a film thickness of about 0.2 μm-0.3 μm. When the touch panel is subject to an antistatic test, the metal conducting line is liable to be broken at a junction point due to high impedance. In addition, in case the metallic bridge structure and a metallic trace structure are formed by thin film deposition, photolithographic and etching, multiple processes are needed to hence increase the equipment cost and waste of materials. Further, in case a plastic substrate is used as a transparent substrate, because the plastic substrate is typically not durable to ultraviolet light and acidic/alkaline solutions, the plastic substrate is liable to be damaged during the photolithographic and etching processes to result in a low production yield.

BRIEF SUMMARY OF THE INVENTION

The invention provides a capacitive touch sensor and a capacitive touch panel to reduce the visibility, line impedance and parasitic capacitance of metallic connecting lines between touch-sensing pads and enhance the electrostatic protection of the capacitive touch panel.

The invention provides a method for fabricating a capacitive touch sensor to effectively increase the production yield and material usage rate, and such fabrication method is also suitable for a plastic substrate.

According to an embodiment of the invention, a capacitive touch sensor includes a plurality of first-axis traces, a plurality of second-axis traces, an insulation layer, and a plurality of metal traces. The first-axis traces are arranged at regular intervals and parallel to each other, where each of the first-axis traces includes a plurality of first touch-sensing pads and first connecting lines, the first touch-sensing pads are arranged along a first direction, and each of the first connecting lines connects two adjacent first touch-sensing pads. The second-axis traces are arranged at regular intervals, parallel to each other and intersected with the first-axis traces, where each of the second-axis traces includes a plurality of second touch-sensing pads and second connecting lines, the second touch-sensing pads are arranged along a second direction perpendicular to the first direction, each of the second connecting lines connects two adjacent second touch-sensing pads, and at least one of the first connecting line and the second connecting line is a metal printing line formed by ink-jet printing. The insulation layer is at least formed between the first connecting lines and the second connecting lines. The metal traces are disposed on the periphery of the capacitive touch sensor, electrically connected to the first-axis traces and the second-axis traces, and connected to at least one signal output terminal for transmitting a sensing signal of the capacitive touch sensor to a back-end signal processing unit through the signal output terminal.

In one embodiment, the line width at each of the two ends of the metal printing line is larger than the line width at the central portion of the metal printing line, and a plurality of sputter deposits are formed on side edges of the metal printing line.

In one embodiment, the metal printing line is a multi-layer stack printing structure and the area of each layer in the multi-layer stack printing structure is decreased from the bottom to the top of the multi-layer stack printing structure.

In one embodiment, the line width of a metal trace at a turning point with an arc angle is larger than that at other portions.

In one embodiment, the insulation layer is formed by ink jet printing.

In one embodiment, the material of the metal printing line includes at least one of diamond-like carbon, ceramic, ink, and photo resist.

According to another embodiment of the invention, a capacitive touch panel includes a cover lens and the above capacitive touch sensor. The cover lens includes a transparent substrate and a decorative layer formed on the transparent substrate.

In one embodiment, the decorative layer includes at least one of diamond-like carbon, ceramic, ink, and photo resist, and the transparent substrate is a glass substrate or a plastic substrate.

According to the design of the above embodiments, since the connecting line to connect two adjacent touch-sensing pads is a metal printing line formed by ink-jet printing, a very narrow connecting line is obtained to thereby reduce the visibility of the connecting line. Thus, the connecting line is not easily observed by a user and the visual effect is improved. In addition, since the line width is greatly decreased as a result of ink-jet printing, an overlapping area between the first metal printing line and the second printing line is significantly decreased to reduce the parasitic capacitance. Furthermore, the printing process may be used to form a multi-layer stack structure to increase the thickness of the metal traces. As the thickness is increased, the impedance is decreased to thereby increase the compatibility of different kinds of IC and reduce the probability of breakage. Besides, under the circumstance, the area to carry static currents is increased to improve electrostatic discharge (ESD) protection.

Another embodiment of the invention provides a method for fabricating a capacitive touch sensor. The fabrication method includes the following steps: providing a transparent substrate; forming a transparent conductive film on the transparent substrate and patterning the transparent conductive film to form a plurality of first touch-sensing pads and a plurality of second touch-sensing pads; printing a metallic material between the first touch-sensing pads to form a plurality of first connecting lines for connecting each two adjacent first touch-sensing pads; printing an insulation layer on the transparent substrate to cover the first connecting lines; printing a metallic material between the second touch-sensing pads to form a plurality of second connecting lines for connecting each two adjacent second touch-sensing pads; and printing a metallic material on the periphery of the transparent substrate to electrically connect the first touch-sensing pads, the second touch-sensing pads and at least one signal output terminal to form a plurality of metal traces.

The above fabrication method can simplify processes and increase material usage rate and is suitable for a glass substrate as well as a plastic substrate.

Other objectives, features and advantages of the invention will be further understood from the further technological features disclosed by the embodiments of the invention wherein there are shown and described preferred embodiments of this invention, simply by way of illustration of modes best suited to carry out the invention.

DETAILED DESCRIPTION OF THE INVENTION

In the following detailed description of the preferred embodiments, reference is made to the accompanying drawings which form a part hereof, and in which are shown by way of illustration specific embodiments in which the invention can be practiced. In this regard, directional terminology, such as "top," "bottom," "front," "back," etc., is used with reference to the orientation of the Figure(s) being described. The components of the invention may be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
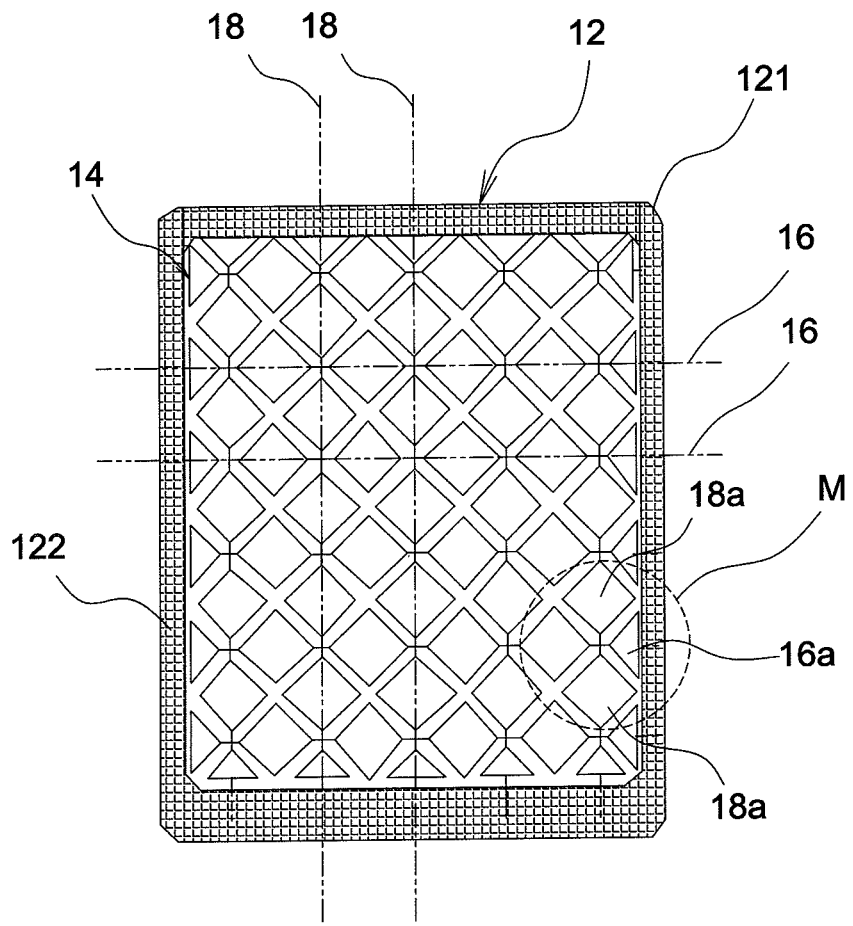
FIG. 1 shows a schematic diagram illustrating a capacitive touch panel according to one embodiment of the invention.
Figure 2:
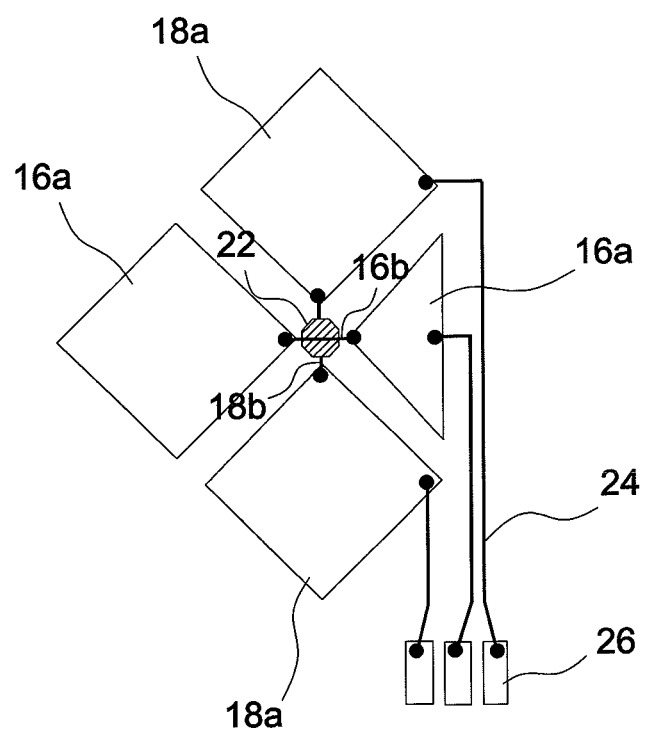
FIG. 2 shows a partial enlarged schematic diagram of FIG. 1.

FIG. 1 shows a schematic diagram illustrating a capacitive touch panel according to one embodiment of the invention, and FIG. 2 shows a partial enlarged schematic diagram M of FIG. 1. Referring to FIG. 1 and FIG. 2, the capacitive touch panel 10 includes a cover lens 12 and a capacitive touch sensor 14 formed on the cover lens 12. The cover lens 12 includes a transparent substrate 121 and a decorative layer 122 formed on the transparent substrate 121. The composition of the decorative layer 122 is not limited, as long as a colored frame to shadow metal traces is provided. For example, the decorative layer 122 is a black matrix layer. The material of the decorative layer 122 may be, for example, at least one of the diamond-like carbon, ceramic, ink, and photo resist. Moreover, the transparent substrate 121 may be a glass substrate or a plastic substrate. The plastic substrate may be, for example, a single layer substrate or a composite substrate including polycarbonate (PC) and polymethyl methacrylate (PMMA). The capacitive touch sensor 14 includes a plurality of X-axis traces 16 arranged at regular intervals and parallel to each other and a plurality of Y-axis traces 18 arranged at regular intervals and parallel to each other. The X-axis traces 16 and the Y-axis traces 18 are intersected with each other to form a matrix. Each X-axis trace includes a plurality of X-axis touch-sensing pads 16a and a plurality of first connecting lines 16b arranged along the X-axis direction, and each first connecting line 16b connects two adjacent X-axis touch-sensing pads 16a. Each Y-axis trace 18 includes a plurality of Y-axis touch-sensing pads 18a and a plurality of second connecting lines 18b arranged along the Y-axis direction, and each second connecting line 18b connects two adjacent Y-axis touch-sensing pads 18a. An insulation layer 22 is formed between the first connecting lines 16b and the second connecting lines 18b to provide dielectric effect. Multiple metal traces 24 are disposed on the periphery of the capacitive touch sensor 14 and electrically connected to the X-axis traces 16 and the Y-axis traces 18. The metal traces 24 are connected to at least one signal output terminal 26 (such as a bonding pad of a flexible circuit board) for transmitting a sensing signal of the capacitive touch sensor 14 to a back-end signal processing unit (such as an IC) through the signal output terminal 26. In this embodiment, at least one of the first connecting line 16b that connects two adjacent X-axis touch-sensing pads and the second connecting line 18b that connects two adjacent Y-axis touch-sensing pads is a metal printing line. The metal printing line is formed by ink-jet printing to result in a very thin connecting line. Therefore, the visibility of the connecting line is greatly reduced, and thus the connecting line is not easy to be observed by a user to improve visual effect. In addition, since the line width is considerably reduced by the ink-jet printing process, an overlapping area between the first connecting line 16b and the second connecting line 18b is significantly decreased to reduce the parasitic capacitance. Certainly, the connecting lines 16b and 18b are not limited to be formed by an ink-jet printing process. For example, one of the connecting lines (such as the first connecting line 16b) may be formed by an ink-jet printing process, and the other connecting line (such as the second connecting line 18b) may be formed by a patterning a transparent electrode (such as an ITO electrode) from which the touch-sensing pads 18a are formed.

Figure 3:
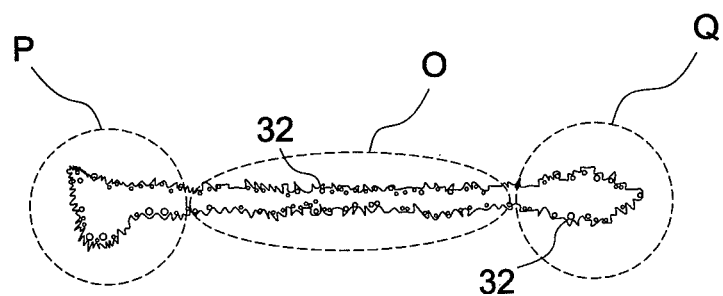
FIG. 3 shows a schematic diagram illustrating the metal printing connecting lines according to one embodiment of the invention.

Further, as shown in FIG. 3, the two ends of the metal printing lines 16*b* and 18*b* fabricated by ink-jet printing are comparatively thicker compared with other portions; that is, the line width at the bridge ends P and Q of a metal printing line is larger than the line width at the central portion O. In addition, a plurality of sputter deposits 32 are formed on the side edges of the metal printing lines 16*b* and 18*b*. In one embodiment, the length of the metal printing lines 16*b* and 18*b* is in the range of 10 μm-200 μm, and the width of the metal printing lines 16*b* and 18*b* is in the range of 1 μm-10 μm.

Figure 4A:
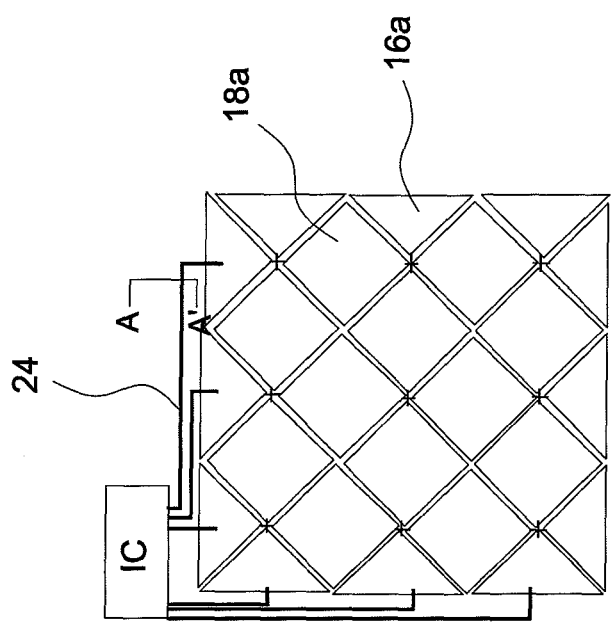
FIG. 4A shows a schematic diagram illustrating a capacitive touch sensor according to one embodiment of the invention.
Figure 4B:
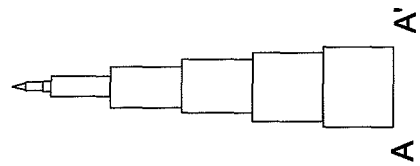
FIG. 4B shows an enlarged cross-section cut along line A-A' in FIG. 4A.

FIG. 4A shows a schematic diagram illustrating a capacitive touch sensor according to one embodiment of the invention, and FIG. 4B shows an enlarged cross-section cut along line A-A' in FIG. 4A. In one embodiment, the metal trace 24 on the periphery of the capacitive touch sensor 14 may be a metal printing line formed by ink-jet printing, and the metal printing line may be a multi-layer stack printing structure, as shown in FIG. 4B. The area of each layer in the multi-layer stack printing structure is decreased from the bottom layer to the top layer. That is, a structure like a lightning rod is formed. Certainly, the metal printing lines 16*b* and 18*b* may also have multi-layer stack printing structures. According to this embodiment, the multi-layer stack printing structure formed by ink jet printing naturally increases the thickness of the metal trace 24. As the thickness is increased, the impedance is decreased to thereby increase the compatibility of different kinds of IC and reduce the probability of breakage. Besides, under the circumstance, the area to carry static currents is increased to improve electrostatic discharge (ESD) protection.

Figure 5:
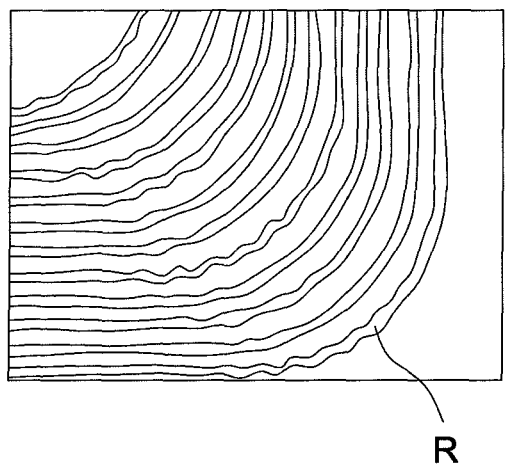
FIG. 5 shows a schematic diagram illustrating the metal printing traces according to one embodiment of the invention.
Figure 6:
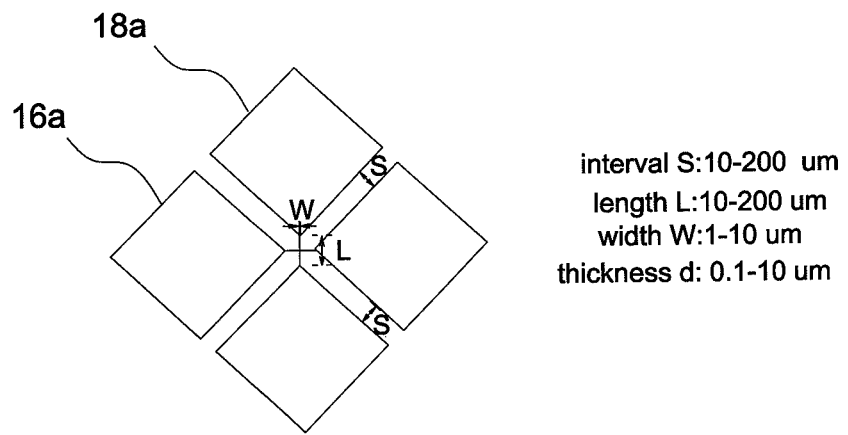
FIG. 6 and FIG. 7 show schematic diagrams illustrating the metal printing connecting lines with different dimensions according to one embodiment of the invention.
Figure 7:
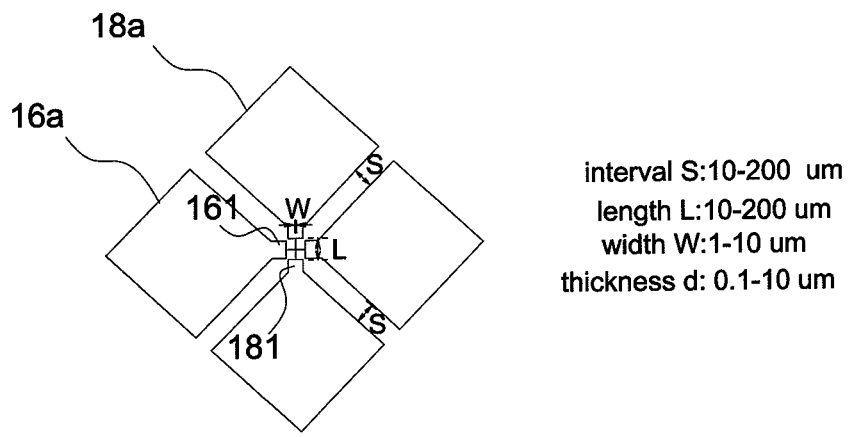

As shown in FIG. 5, the metal trace 24 formed by ink-jet printing has a turning point R with an arc angle, and the line width at the turning point R is larger than that at other portions. Furthermore, in one embodiment, the insulation layer 22 formed between the first metal printing line 16*b* and the second metal printing line 18*b* may be formed by ink-jet printing. FIG. 6 and FIG. 7 show schematic diagrams illustrating metal printing connecting lines with different dimensions according to different embodiments of the invention. Compared with a conventional bridge line formed by a photolithography process, the line width and length of a connecting line formed by ink-jet printing is greatly decreased and an interval between two adjacent touch-sensing pads is also decreased. Moreover, as shown in FIG. 7, two adjacent X-axis touch-sensing pads 16*a* may be each provided with a first extrusion 161 extending towards each other, and two adjacent Y-axis touch-sensing pads 18*a* may be each provided with a second extrusion 181 extending towards each other to further decrease the line length.

Besides, in the above embodiments, the material of the metal printing line is not limited, as long as good conductivity is provided. For example, the material of the metal printing line may be at least one of transparent metal oxide (such as ITO, IZO, AZO and GZO), conductive polymer (such as PEDOT:PSS), nano metal (such as nano silver fiber) and carbon nano tube.

Figure 8:
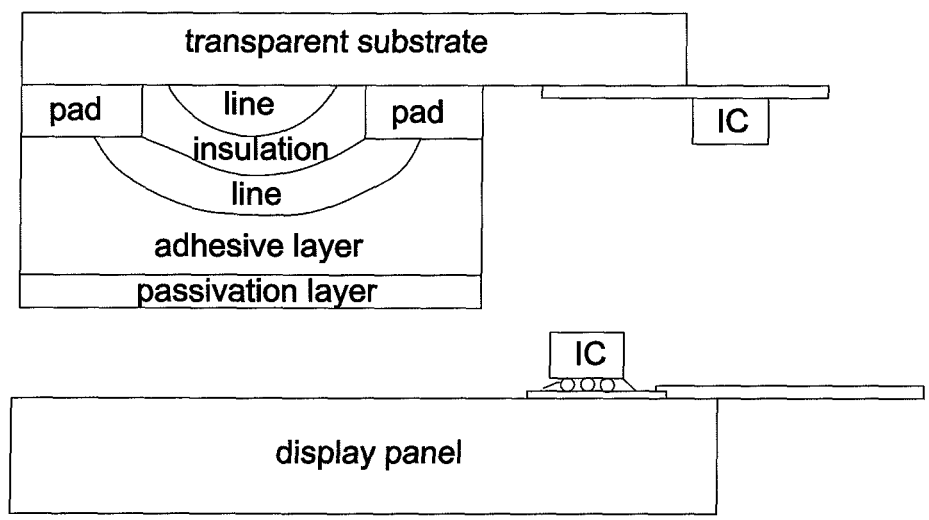
FIG. 8 show a schematic diagram illustrating a touch-sensing display device according to one embodiment of the invention.

Referring to FIG. 8, the following will describe a method for fabricating a capacitive touch sensor and a capacitive touch panel according to one embodiment of the invention. At first, a transparent conductive film is coated on a transparent substrate, and then the transparent conductive film is patterned by a photolithographic process or a laser abrasion process to form a plurality of first touch-sensing pads and a plurality of second touch-sensing pads. Then, a metallic material is printed between the first touch-sensing pads to form a plurality of first connecting lines each for connecting two adjacent first touch-sensing pads, and an insulation layer is printed on the transparent substrate to cover the first connecting lines. Subsequently, a metallic material is printed between the second touch-sensing pads to form a plurality of second connecting lines each for connecting two adjacent second touch-sensing pads. Besides, a metallic material is printed on the periphery of the transparent substrate to electrically connect the first touch-sensing pads, the second touch-sensing pads and at least one signal output terminal to form a plurality of metal traces. Besides, an adhesive layer and a passivation layer may be formed on the transparent substrate, and the passivation layer covers the first touch-sensing pads, the second touch-sensing pads and the connecting lines through the adhesive layer. After the above processes are preformed, a capacitive touch sensing structure is formed and then connected to a flexible circuit board or an IC and further to a display panel to form a touch-sensing display device 40. The type of the display panel is not limited and may be, for example, a liquid crystal display panel, an organic light emitting diode display panel, an electro-wetting display panel, a bi-stable display panel and the like. Besides, in one embodiment, a decorative layer may be formed on the transparent substrate substantially overlapping the metal traces. The above fabrication method may simplify fabrication processes and increase the material usage rate and may be performed on a glass substrate or a plastic substrate.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the present disclosure is intended to be dedicated to the public regardless of whether the element or component is explicitly recited in the following claims.

What is claimed is:

1. A capacitive touch sensor, comprising:
a plurality of first-axis traces, wherein each of the first-axis traces comprises a plurality of first touch-sensing pads and first connecting lines, the first touch-sensing pads are arranged along a first direction, each of the first connecting lines connects two adjacent first touch-sensing pads, and each of the first connecting lines has an enlarged portion at each of the opposed end portions;

a plurality of second-axis traces intersected with the first-axis traces, wherein each of the second-axis traces comprises a plurality of second touch-sensing pads and second connecting lines, the second touch-sensing pads are arranged along a second direction different to the first direction, each of the second connecting lines connects two adjacent second touch-sensing pads, and each of the second connecting lines has an enlarged portion at each of the opposed end portions;

an insulation layer at least formed between the first connecting lines and the second connecting lines; and a plurality of metal traces disposed on the periphery of the capacitive touch sensor, electrically connected to the first-axis traces and the second-axis traces, and connected to at least one signal output terminal for transmitting a sensing signal of the capacitive touch sensor to a back-end signal processing unit through the signal output terminal.

2. The capacitive touch sensor as claimed in claim 1, wherein each one of two adjacent first touch-sensing pads has a first extrusion extending towards the other, and each one of two adjacent second touch-sensing pads has a second extrusion extending towards the other.

3. The capacitive touch sensor as claimed in claim 1, wherein the material of at least one of the first connecting lines and the second connecting lines is metal.

4. The capacitive touch sensor as claimed in claim 1, wherein at least one of the first connecting lines and the second lines is a multi-layer stack structure and the area of each layer in the multi-layer stack structure is decreased from the bottom to the top of the multi-layer stack structure.

5. The capacitive touch sensor as claimed in claim 1, wherein each of the metal traces is a multi-layer stack structure and an area of each layer in the multi-layer stack structure is decreased from the bottom to the top of the multi-layer stack structure.

6. A capacitive touch sensor, comprising:

a plurality of first-axis traces arranged at regular intervals and parallel to each other, wherein each of the first-axis traces comprises a plurality of first touch-sensing pads and first connecting lines, the first touch-sensing pads are arranged along a first direction, and each of the first connecting lines connects two adjacent first touch-sensing pads, and each of the first connecting lines has an enlarged portion at each of the opposed end portions;

a plurality of second-axis traces arranged at regular intervals, parallel to each other and intersected with the first-axis traces, wherein each of the second-axis traces comprises a plurality of second touch-sensing pads and second connecting lines, and the second touch-sensing pads are arranged along a second direction different to the first direction; and an insulation layer at least formed between the first connecting lines and the second connecting lines.

7. The capacitive touch sensor as claimed in claim 6, further comprising a plurality of metal traces disposed on the periphery of the capacitive touch sensor, electrically connected to the first-axis traces and the second-axis traces, and connected to at least one signal output terminal for transmitting a sensing signal of the capacitive touch sensor to a back-end signal processing unit through the signal output terminal.

8. The capacitive touch sensor as claimed in claim 7, wherein each of the metal traces is a multi-layer stack structure and an area of each layer in the multi-layer stack structure is decreased from the bottom to the top of the multi-layer stack structure.

9. The capacitive touch sensor as claimed in claim 6, wherein each one of two adjacent first touch-sensing pads has a first extrusion extending towards the other, and each one of two adjacent second touch-sensing pads has a second extrusion extending towards the other.

10. The capacitive touch sensor as claimed in claim 6, wherein the material of at least one of the first connecting lines and the second connecting lines is metal.

11. The capacitive touch sensor as claimed in claim 6, wherein at least one of the first connecting lines and the second lines is a multi-layer stack structure and the area of each layer in the multi-layer stack structure is decreased from the bottom to the top of the multi-layer stack structure.

12. A capacitive touch panel, comprising:

a cover lens; and a touch sensor formed on the cover lens and comprising:

a plurality of first-axis traces, wherein each of the first-axis traces comprises a plurality of first touch-sensing pads and first connecting lines, the first touch-sensing pads are arranged along a first direction, each of the first connecting lines connects two adjacent first touch-sensing pads, and each of the first connecting lines has an enlarged portion at each of the opposed end portions;

a plurality of second-axis traces intersected with the first-axis traces, wherein each of the second-axis traces comprises a plurality of second touch-sensing pads and second connecting lines, the second touch-sensing pads are arranged along a second direction different to the first direction, and each of the second connecting lines connects two adjacent second touch-sensing pads;

an insulation layer at least formed between the first connecting lines and the second connecting lines; and a plurality of metal traces disposed on the periphery of the capacitive touch sensor, electrically connected to the first-axis traces and the second-axis traces, and connected to at least one signal output terminal for transmitting a sensing signal of the capacitive touch sensor to a back-end signal processing unit through the signal output terminal.

13. The capacitive touch panel as claimed in claim 12, wherein the cover lens comprises a substrate and a decorative layer formed on the substrate.

14. The capacitive touch panel as claimed in claim 13, wherein the substrate is a glass substrate or a plastic substrate.

15. The capacitive touch panel as claimed in claim 12, wherein the decorative layer is formed at a position overlapping the metal traces.

16. The capacitive touch panel as claimed in claim 12, wherein the material of the decorative layer comprises at least one of diamond-like carbon, ceramic, ink, and photo resist.

17. The capacitive touch panel as claimed in claim 12, wherein each one of two adjacent first touch-sensing pads has a first extrusion extending towards the other, and each one of two adjacent second touch-sensing pads has a second extrusion extending towards the other.

18. The capacitive touch panel as claimed in claim 12, wherein the material of at least one of the first connecting lines and the second connecting lines is metal.

19. The capacitive touch panel as claimed in claim 12, wherein at least one of the first connecting lines and the second connecting lines is a multi-layer stack structure and the area of each layer in the multi-layer stack structure is decreased from the bottom to the top of the multi-layer stack structure.

20. The capacitive touch panel as claimed in claim 12, wherein each of the metal traces is a multi-layer stack structure and an area of each layer in the multi-layer stack structure is decreased from the bottom to the top of the multi-layer stack structure.

* * * * *